(12) United States Patent
Thurk

(10) Patent No.: US 7,750,352 B2
(45) Date of Patent: Jul. 6, 2010

(54) LIGHT STRIPS FOR LIGHTING AND BACKLIGHTING APPLICATIONS

(75) Inventor: Paul Thurk, Austin, TX (US)

(73) Assignee: Pinion Technologies, Inc., Round Rock, TX (US)

( * ) Notice: Subject to any disclaimer, the term of this patent is extended or adjusted under 35 U.S.C. 154(b) by 634 days.

(21) Appl. No.: 11/201,406

(22) Filed: Aug. 10, 2005

(65) Prior Publication Data

US 2006/0034065 A1    Feb. 16, 2006

Related U.S. Application Data

(60) Provisional application No. 60/600,201, filed on Aug. 10, 2004.

(51) Int. Cl.
*H01L 33/00* (2010.01)
*H01L 49/00* (2010.01)

(52) U.S. Cl. ............... 257/79; 257/86; 257/103; 257/E33.015; 257/E49.001; 977/773

(58) Field of Classification Search ............ 257/79, 257/103, 86, E33.015, E49.001; 345/170, 345/102
See application file for complete search history.

(56) References Cited

U.S. PATENT DOCUMENTS

| | | | |
|---|---|---|---|
| 3,842,306 A | 10/1974 | Henderson et al. | |
| 4,047,069 A | 9/1977 | Akutsu et al. | |
| 4,159,443 A | 6/1979 | Stocker et al. | |
| 4,330,691 A | 5/1982 | Gordon | |
| 4,642,951 A | 2/1987 | Mortimer | |
| 4,890,033 A | 12/1989 | Ichinomiya | |
| 4,923,032 A | 5/1990 | Nuernberger | |
| 4,965,485 A | 10/1990 | Tarumi et al. | |
| 5,073,805 A | 12/1991 | Nomura et al. | |
| 5,142,343 A | 8/1992 | Hosokawa et al. | |
| 5,293,050 A | 3/1994 | Chapple-Sokol et al. | |
| 5,354,707 A | 10/1994 | Chapple-Sokol et al. | |
| 5,391,088 A * | 2/1995 | Tomchak et al. ............ 439/216 | |
| 5,422,489 A | 6/1995 | Bhargava | |
| 5,438,234 A | 8/1995 | Fujino | |
| 5,516,577 A | 5/1996 | Matsuura et al. | |

(Continued)

FOREIGN PATENT DOCUMENTS

EP    1111966    6/2001

(Continued)

OTHER PUBLICATIONS

Color, Jan. 16, 2004, Encyclopedia Encarta.*

(Continued)

*Primary Examiner*—Lynne A Gurley
*Assistant Examiner*—Jesse Y Miyoshi
(74) *Attorney, Agent, or Firm*—Foley & Lardner LLP

(57) ABSTRACT

Light strips for emergency lighting, path lighting, accent lighting and device lighting are provided. Devices incorporating and lighted by the light strips are also provided. The light strips include a light emitting layer made from a plurality of semiconductor nanoparticles disposed between and in electrical communication with an anode and a cathode. The semiconductor nanoparticles may be made from Group IV semiconductors, such as silicon. Devices that may be lit with the light strips include displays and keypad, such as those found in cellular phones and personal digital assistants.

15 Claims, 7 Drawing Sheets

U.S. PATENT DOCUMENTS

| | | | |
|---|---|---|---|
| 5,536,949 A | 7/1996 | Hosokawa et al. | |
| 5,537,000 A | 7/1996 | Alivisatos et al. | |
| 5,552,665 A | 9/1996 | Trushell | |
| 5,796,509 A | 8/1998 | Doany et al. | |
| 5,813,753 A | 9/1998 | Vriens et al. | |
| 5,850,064 A | 12/1998 | Goldstein | |
| 5,852,346 A | 12/1998 | Komoda et al. | |
| 5,882,779 A | 3/1999 | Lawandy | |
| 5,927,845 A | 7/1999 | Gustafson | |
| 5,959,316 A | 9/1999 | Lowery | |
| 5,960,942 A | 10/1999 | Thornton | |
| 5,962,863 A | 10/1999 | Russell et al. | |
| 5,977,565 A | 11/1999 | Ishikawa et al. | |
| 5,990,479 A | 11/1999 | Weiss et al. | |
| 6,023,371 A | 2/2000 | Onitsuka et al. | |
| 6,049,090 A * | 4/2000 | Clark, Jr. | 257/13 |
| 6,068,907 A | 5/2000 | Beauregard | |
| 6,069,440 A | 5/2000 | Shimizu et al. | |
| 6,117,514 A | 9/2000 | Herrmann | |
| 6,157,047 A | 12/2000 | Fujita et al. | |
| 6,159,620 A * | 12/2000 | Heath et al. | 428/615 |
| 6,169,359 B1 | 1/2001 | Sun et al. | |
| 6,175,187 B1 | 1/2001 | Tsutsui | |
| 6,207,229 B1 | 3/2001 | Bawendi et al. | |
| 6,215,881 B1 | 4/2001 | Azima et al. | |
| 6,245,259 B1 | 6/2001 | Höhn et al. | |
| 6,251,303 B1 | 6/2001 | Bawendi et al. | |
| 6,252,254 B1 | 6/2001 | Soules et al. | |
| 6,252,356 B1 | 6/2001 | Tanabe et al. | |
| 6,252,915 B1 | 6/2001 | Mollenkopf et al. | |
| 6,268,041 B1 | 7/2001 | Goldstein | |
| 6,283,612 B1 | 9/2001 | Hunter | |
| 6,310,609 B1 * | 10/2001 | Morgenthaler | 345/170 |
| 6,322,901 B1 * | 11/2001 | Bawendi et al. | 428/548 |
| 6,336,837 B1 | 1/2002 | Maeda | |
| 6,389,771 B1 | 5/2002 | Moller | |
| 6,397,531 B1 | 6/2002 | Martin | |
| 6,406,803 B1 | 6/2002 | Abe et al. | |
| 6,417,019 B1 | 7/2002 | Mueller et al. | |
| 6,423,551 B1 | 7/2002 | Weiss et al. | |
| 6,441,551 B1 | 8/2002 | Abe et al. | |
| 6,501,091 B1 | 12/2002 | Bawendi et al. | |
| 6,501,102 B2 | 12/2002 | Mueller-Mach et al. | |
| 6,504,179 B1 | 1/2003 | Ellens et al. | |
| 6,508,573 B1 | 1/2003 | Yamazaki | |
| 6,515,314 B1 * | 2/2003 | Duggal et al. | 257/184 |
| 6,521,915 B2 | 2/2003 | Odaki et al. | |
| 6,522,065 B1 | 2/2003 | Srivastava et al. | |
| 6,526,213 B1 | 2/2003 | Ilenda et al. | |
| 6,544,870 B2 | 4/2003 | Park et al. | |
| 6,566,808 B1 | 5/2003 | Duggal et al. | |
| 6,585,947 B1 | 7/2003 | Nayfeh et al. | |
| 6,602,671 B1 * | 8/2003 | Bawendi et al. | 435/7.1 |
| 6,602,731 B2 | 8/2003 | Andriessen | |
| 6,608,330 B1 | 8/2003 | Yamada | |
| 6,632,694 B2 | 10/2003 | Torvik | |
| 6,649,138 B2 | 11/2003 | Adams et al. | |
| 6,660,410 B2 | 12/2003 | Hosokawa | |
| 6,661,029 B1 | 12/2003 | Duggal | |
| 6,669,158 B2 | 12/2003 | Masas | |
| 6,673,292 B1 | 1/2004 | Gustafson et al. | |
| 6,692,512 B2 | 2/2004 | Jang | |
| 6,692,986 B1 | 2/2004 | Bayer et al. | |
| 6,693,512 B1 | 2/2004 | Frecska et al. | |
| 6,698,543 B2 | 3/2004 | Golterman | |
| 6,700,322 B1 | 3/2004 | Duggal et al. | |
| 6,701,686 B1 | 3/2004 | Platt | |
| 6,702,958 B2 | 3/2004 | Takehara et al. | |
| 6,703,781 B2 | 3/2004 | Zovko | |
| 6,733,147 B2 | 5/2004 | Wang et al. | |
| 6,747,402 B2 * | 6/2004 | Hato et al. | 313/305 |
| 6,777,724 B2 * | 8/2004 | Duggal et al. | 257/184 |
| 6,787,990 B2 * | 9/2004 | Cok | 313/504 |
| 6,796,624 B2 * | 9/2004 | Park | 312/313 |
| 6,815,064 B2 * | 11/2004 | Treadway et al. | 428/403 |
| 6,837,604 B2 * | 1/2005 | Douzono et al. | 362/545 |
| 6,853,132 B2 * | 2/2005 | Maeda | 313/504 |
| 6,906,339 B2 * | 6/2005 | Dutta | 257/40 |
| 6,918,946 B2 * | 7/2005 | Korgel et al. | 75/362 |
| 6,936,783 B2 * | 8/2005 | Kawaguchi et al. | 200/514 |
| 6,956,561 B2 * | 10/2005 | Han | 345/170 |
| 6,959,208 B2 * | 10/2005 | Tanaka et al. | 455/567 |
| 2001/0000622 A1 | 5/2001 | Reeh et al. | |
| 2001/0009351 A1 | 7/2001 | Hosokawa et al. | |
| 2001/0040232 A1 | 11/2001 | Bawendi et al. | |
| 2002/0004251 A1 | 1/2002 | Roberts et al. | |
| 2002/0018632 A1 | 2/2002 | Pelka | |
| 2002/0025391 A1 | 2/2002 | Angelopoulos et al. | |
| 2002/0045276 A1 * | 4/2002 | Yguerabide et al. | 436/518 |
| 2002/0050975 A1 * | 5/2002 | Knox et al. | 345/102 |
| 2002/0152704 A1 | 10/2002 | Thompson et al. | |
| 2002/0153830 A1 | 10/2002 | Andriessen | |
| 2002/0167024 A1 | 11/2002 | Jabbour et al. | |
| 2002/0183098 A1 * | 12/2002 | Lee et al. | 455/566 |
| 2002/0186921 A1 * | 12/2002 | Schumacher et al. | 385/31 |
| 2003/0003300 A1 * | 1/2003 | Korgel et al. | 428/402 |
| 2003/0003614 A1 | 1/2003 | Andriessen | |
| 2003/0034486 A1 | 2/2003 | Korgel | |
| 2003/0042850 A1 | 3/2003 | Bertram et al. | |
| 2003/0047816 A1 | 3/2003 | Dutta | |
| 2003/0057821 A1 | 3/2003 | Fink et al. | |
| 2003/0066998 A1 | 4/2003 | Lee | |
| 2003/0067265 A1 | 4/2003 | Srivastava et al. | |
| 2003/0080677 A1 | 5/2003 | Mikhael et al. | |
| 2003/0094626 A1 | 5/2003 | Duggal et al. | |
| 2003/0173541 A1 | 9/2003 | Peng et al. | |
| 2003/0186023 A1 | 10/2003 | Isoda et al. | |
| 2003/0222572 A1 | 12/2003 | Su et al. | |
| 2003/0227249 A1 | 12/2003 | Mueller et al. | |
| 2004/0007169 A1 | 1/2004 | Ohtsu et al. | |
| 2004/0018382 A1 | 1/2004 | Kinlen | |
| 2004/0023010 A1 | 2/2004 | Bulovic et al. | |
| 2004/0027062 A1 | 2/2004 | Shiang et al. | |
| 2004/0031966 A1 | 2/2004 | Forrest et al. | |
| 2004/0032214 A1 | 2/2004 | Lee et al. | |
| 2004/0033345 A1 | 2/2004 | Dubertret et al. | |
| 2004/0036130 A1 | 2/2004 | Lee et al. | |
| 2004/0105980 A1 | 6/2004 | Sudarshan et al. | |
| 2004/0109666 A1 | 6/2004 | Kim | |
| 2004/0124352 A1 | 7/2004 | Kashima et al. | |
| 2004/0126582 A1 * | 7/2004 | Ng et al. | 428/403 |
| 2004/0145307 A1 | 7/2004 | Odaki | |
| 2004/0245912 A1 | 12/2004 | Thurk et al. | |
| 2004/0252488 A1 | 12/2004 | Thurk | |
| 2005/0236556 A1 * | 10/2005 | Sargent et al. | 250/214.1 |
| 2005/0266697 A1 | 12/2005 | Korgel et al. | |
| 2006/0068154 A1 * | 3/2006 | Parce et al. | 428/76 |
| 2008/0160265 A1 | 7/2008 | Hieslmair et al. | |
| 2008/0160733 A1 | 7/2008 | Hieslmair et al. | |

FOREIGN PATENT DOCUMENTS

JP  2000-285760  * 10/2000

OTHER PUBLICATIONS

Bauer et al., "Laser Synthesis of Low-Agglomerated Submicrometer Silicon Nitride Powders from Chlorinated Silanes," *J. Am. Ceram. Soc.*, 74 (11), pp. 2759-2768, 1991; published by American Ceramic Society, Westerville, OH.

Heinrich et al., "Luminescent colloidal silicon suspensions from porous silicon," *Science*, vol. 255, pp. 66-68, 1992; published by American Association for the Advancement of Science, Washington, D.C.

Seraphin et al., "Influence of nanostructure size on the luminescence behavior of silicon nanoparticle thin films," *J. Mater. Res.*, vol. 12, No. 12, pp. 3386-3392, 1997; published by Materials Research Society.

Dabbousi et al., "(CdSe)ZnS core-shell quantum dots: synthesis and characterization of a size series of highly luminescent nanocrystallites," *J. Phys. Chem. B*, vol. 101 (46), pp. 9463-9475, 1997; published by American Chemical Society.

Allongue, "Porous silicon formation mechanisms," Properties of Porous Silicon, Leigh Canham Ed., ISBN 0852969325, pp. 3-29, 1997; published by INSPEC.

Gorla et al., "Silicon and germanium nanoparticle formation in an inductively coupled plasma reactor," *J. Vac. Sci. Technol. A.*, vol. 15(3), pp. 860-864, 1997; published by American Institute of Physics.

Jabbour et al., "Highly efficient and bright organic electroluminescent devices with an aluminum cathode," *Applied Physics Letters*, vol. 71(13), pp. 1762-1764, 1997; published by American Institute of Physics.

Credo et al., "External quantum efficiency of single porous silicon nanoparticles," *Applied Physics Letters*, vol. 74, No. 14, pp. 1978-1980, 1999; published by American Institute of Physics.

Holmes et al., Control of thickness and orientation of solution-grown silicon nanowires, *Science*, 287, pp. 1471-1473, 2000.

Belomoin et al., "Oxide and hydrogen capped ultrasmall blue luminescent Si nanoparticles," *Appl. Phys. Lett.*, vol. 77 (6), pp. 779-781, 2000; published by American Institute of Physics.

Holmes et al., "Highly luminescent silicon nanocrystals with discrete optical transitions," *J. Am. Chem. Soc.*, vol. 123, pp. 3743-3748, 2001; published by American Chemical Society.

Ledoux et al., "Effect of passivation and aging on the photoluminescence of silicon nanocrystals," *Applied Physics Letters*, vol. 79, No. 24, pp. 4028-4030, 2001; published by American Institute of Physics.

Kang et al., "Enhancing the electroluminescent properties of organic light-emitting devices using a thin NaCl layer," *Applied Physics Letters*, vol. 81, No. 14, pp. 2581-2583, 2002; published by American Institute of Physics.

Pell et al., Single particle and ensemble spectroscopy of silicon nanoparticles, *Mat. Res. Symp. Proc.*, vol. 704, pp. 17-21, 2002; published by Materials Research Society.

Belomoin et al., "Observation of a magic discrete family of ultrabright Si nanoparticles," *Appl. Phys. Lett.*, vol. 80 (5), pp. 841-843, Feb. 2002; published by American Institute of Physics.

English et al., "Size tunable visible luminescence from individual organic monolayer stabilized silicon nanocrystal quantum dots," *Nano Letters*, vol. 2, pp. 681-685, 2002; published by American Chemical Society, Washington, D.C.

Hanrath et al., "Nucleation and growth of germanium nanowires seeded by organic monolayer-coated gold nanocrystals," *J. Am. Chem. Soc.*, vol. 124, No. 7, pp. 1424-1429, 2002; published by American Chemical Society.

"Organic light emitting diodes (OLEDs) for general illumination Update 2002." An Optoelectronics Industry Development Association (OIDA) Technology Roadmap; published by Optoelectronics Industry Development Association.

Huisken et al., "Light-emitting silicon nanocrystals from laser pyrolysis," *Adv. Mater.*, vol. 14(24), pp. 1861-1865, 2002; published by VCH Publishers, Deerfield Beach, FL.

Madou, "Pattern transfer with additive techniques," *Fundamentals of Microfabrication, The Science of Miniaturization*, $2^{nd}$ Ed., Chapter 3., 2002; published by CRC Press, Boca Raton, FL.

Zukauskas, et al., "Introduction to solid-state lighting," *Vision, Photometry and Colorimetry*, Ch. 2, pp. 7-19, 2002; published by John Wiley & Sons, New York.

Lu et al., "Growth of single crystal silicon nanowires in supercritical solution from tethered gold particles on a silicon substrate," *Nanoletters*, 2003, vol. 3, No. 1, pp. 93-99, 2003; published by American Chemical Society.

Durel 3 Lamp Technology, www.rogerscorporation.com, website article, (date unavailable).

Buriak, "Organometallic Chemistry on Silicon and Germanium Surfaces," *Chemical Reviews*, vol. 102, No. 5, May 2002, pp. 1271-1308.

Ding et al., "Electrochemistry and Electrogenerated Chemiluminescence from Silicon Nanocrystal Quantum Dots," *Science*, vol. 296, May 17, 2002, pp. 1293-1297.

\* cited by examiner

LIGHT STRIPS FOR LIGHTING AND BACKLIGHTING APPLICATIONS

CLAIM OF PRIORITY

The present application claims priority to U.S. Provisional Patent Application No. 60/600,201, filed Aug. 10, 2004, the entire contents of which are hereby incorporated by reference.

FIELD OF THE INVENTION

This invention generally relates to light strips for use in emergency lighting, path lighting, accent lighting and electronic device lighting and to devices incorporating the light strips.

BACKGROUND

In the U.S., about one-quarter of the nation's electricity budget is spent on lighting, or more than $37 billion annually. Most of this expense results from the use of conventional incandescent and fluorescent lighting. Unfortunately, the efficiency of current incandescent and fluorescent lamps plateaued many years ago at 5% and 20%, respectively. Due to the large electricity cost associated with conventional incandescent and fluorescent light sources, much attention has focused recently on more energy efficient lighting alternatives. Specialty lighting applications such as emergency and accent lighting and backlighting for electronic devices have similar problems with finding power-efficient devices that also meet the spectral requirements of the particular application in which they are intended. The market for such specialty lighting applications can be sizeable. For example, recent estimates put the market for emergency lighting used in buildings and airplanes at almost $6 billion annually. Similarly, backlighting for the cellular phone industry has been estimated to be about $1.5 billion annually. There is a dire need for new illumination sources that can provide inexpensive, energy efficient and quality light of all colors and color mixes.

One alternative is provided by Solid State Lighting (SSL). SSL is a lighting technology that uses light emitting diodes (LEDs) for white light general illumination. SSL has the potential to offer enormous economic and environmental advantages over conventional lighting technologies for general illumination, promising efficiencies in excess of 50%. In addition, SSL offers advantages in color tunability, design flexibility, robustness, long lifetimes, mercury-free manufacturing, and fast turn on times. Although this solid state lighting provides advantages in terms of efficiency, power consumption and cost and ease of production, each of these areas are still in need of improvement.

Light strips are commonly used to illuminate pathways or to mark locations in unlit or poorly lit indoor and outdoor areas. Many types of light strips, including strips based on a tubes, bulbs, reflectors or a series of light emitting diodes, have been used in an attempt to provide emergency, path and accent lighting. Unfortunately, these light strips have met with only limited success in providing a light strip characterized by low heat output, low power consumption, low profile, long lifetimes, and low cost of ownership.

Backlighting systems are presently employed for a variety of display purposes such as for illuminating displays and keypads in electronic devices, including cellular phones. Backlighting provides a higher contrast between display graphics the display background. A good backlighting system will provide brightness, uniform light distribution, and low power usage. The latter characteristic is especially important in portable, battery-operated applications such as cellular phones where power usage directly affects battery life.

In a typical display, such as a liquid crystal display, a light source is located behind the display and illuminates the display, where the back light passes through the display and is collected on the display's front side for observation by a viewer. Conventional backlight sources for displays in electronic devices are neither simple nor compact. For example, the backlight source might be a fluorescent light tube, in combination with a reflector, light guide and diffuser. Alternatively, the backlight source may comprise complex optical systems that use conventional solid-state red, green and blue light emitting diodes (LEDs). Most of these backlights are complex and involve high and manufacturing time and costs. In addition, even backlights made from light-emitting diodes or inorganic electroluminescent materials typically do not provide adequate characteristics in terms of viewing angle of light, uniformity, color tone, light-emitting intensity, light-emitting efficiency or flexibility in backlighting pattern or design.

Like many electronic devices that include a display, key-operated electronic devices also rely upon backlighting to enable a user to view and identify the position of keys on a keypad in areas with little or no ambient light. These keypad backlights generally have luminaries similar to the display backlights and suffer from many of the same disadvantages.

Thus a need exists for efficient lighting materials for low cost, low profile and low power consumption emergency, path, accent and backlighting.

SUMMARY

Low profile light strips and devices incorporating the light strips are provided. The light strips, which are based on electroluminescent semiconductor nanoparticles, provide efficient, low cost, low heat, low power accent lighting, path lighting, emergency lighting and electronic device lighting. The light strips may be used as stand-alone illumination sources or as illumination sources in electronic devices. The light strips are particularly well-suited for providing backlighting and even direct lighting for displays and keypads in cellular phones, personal digital assistants, watches and the like.

The light strips may be designed to electroluminesce in a variety of colors across the visible spectrum including, but not limited to, blue, green, red, and white. The intensity and/or color of the light emitted along the length light strips may be modulated such that different regions of the light strip produce different light intensities and/or colors.

In their basic form, the light strips comprise a first substantially transparent electrode layer (e.g., an anode), a second electrode layer (e.g., a cathode) and a light emitting layer made from a plurality of semiconductor nanoparticles positioned between the electrodes. When an adequate voltage is applied across the electrodes, the nanoparticles emit electroluminescence. The substantially transparent electrode layer may optionally be disposed atop a substantially transparent substrate which serves as a protective layer and/or insulator. Similarly a second substrate may be disposed below the second electrode to provide a protective and/or insulating layer. Typically the nanoparticles will be dispersed in or on a binder layer, which is desirably an inorganic film or a flexible conductive polymeric thin film. In response to an electrical signal applied across the electrodes, the nanoparticles electroluminesce to provide a source of illumination.

The light strips may be designed to operate using an direct current (DC) voltage source or an alternating current (AC) voltage source. For example, because the power strips have low power requirements, they may use a battery as a DC voltage source. In some embodiments the light strips may even be designed to switch between an AC and a DC voltage source. In one illustrative embodiment, a light strip designed to use a DC voltage source may optionally include a hole transport layer disposed between the first electrode and the nanoparticle layer and/or an electron transport layer disposed between the second electrode and the nanoparticle layer. The light strip is desirably of an organic light emitting diode (OLED) construction wherein the layers between the anode and cathode are all organic thin films in a laminar structure. In another illustrative embodiment, a light strip designed to use an AC voltage source may include dielectric layers disposed between the light emitting layer and the first and second electrodes. In an alternative embodiment, one or both of the dielectric layers may be eliminated by using a dispersing the nanoparticles in a dielectric binder medium The voltage required to induce the nanoparticles in the light emitting layer of a light strip to electroluminesce may vary depending upon a variety of factors including the nature and size of the semiconductor nanoparticles. By way of illustration only, in some embodiments the DC voltage of about 3 to about 20 volts will be sufficient to induce electroluminescence. In embodiments where an AC voltage is used the voltage may be much higher (e.g., 10 to 200 volts). The electrodes can be connected to a voltage source using known mechanical and chemical means to provide conduction including, for example, pins, foils, terminals, spring clips, electrical contacts, conductive grease, and conductive adhesives such as conductive epoxy.

One of the factors that will affect the intensity of electroluminescence emitted along a portion of the length of the light strip is the density of nanoparticles in that portion. The color of the light emitting along a portion of the length of the light strip will depend on the size distribution of the nanoparticles in that portion. In various preferred embodiments, the light strips have an intensity and/or color distribution that is not uniform along their length.

The light strips are desirably flexible and may have a variety of dimensions. For example, in some embodiments the light strips will take the form of long tapes that may be used to outline objects in accent, path or emergency lighting applications. In these applications the light strips will typically have a width of no more a few centimeters (cm) (e.g., no more than about 10 cm, no more than about 8 cm, no more than about 6 cm or no more than about 4 cm) and a length of at least about 30 cm, or even longer. For example, some strips may have lengths of many meters. It should be understood, however, that the above-quoted dimensions are only intended to be illustrative and not limiting. The light strips may have locking means on one or both ends to allow multiple strips to be interlocked together to provide a desired length and color pattern. In other embodiments the light strips will take the form of flexible plates dimensioned to fit neatly inside an electronic device for backlighting applications. For example the light strips may be dimensioned to fit behind the face plate of a cellular phone, a personal digital assistant or a watch. The light strips are desirably thin flexible strips that may be provided as a roll of material that may be cut to provide the desired dimensions.

The light strips may include an adhesive layer applied to the underside of the strip (e.g., to the underside of the cathode or any substrate disposed below the cathode) in order to facilitate application of the light strips to a surface or inside an electronic device. Alternatively, the light strips may be provided with fastening means, such as screw holes, hooks, pins or the like, for fastening the light strips to a surface or to the inside of an electronic device.

Although the nature of the semiconductor nanoparticles may vary depending on the desired electroluminescence color and intensity, in some embodiments the nanoparticles comprises Group IV elements, such as silicon and germanium. These semiconductor nanoparticles may be core/shell type nanoparticles having a semiconductor core encapsulated in an inorganic or organic passivating shell which prevents degradation of the nanoparticles.

Specific applications for which the light strips provided herein may be employed as stand alone illumination sources include, but are not limited to, emergency lighting (e.g., in airplanes), path lighting (e.g., in movie theaters and the like), and accent lighting (e.g., in and around commercial displays, shelves and the like).

Specific applications for which the light strips provided herein may be employed as illumination sources in electronic devices include, but are not limited to, direct and backlighting sources for display and keypads in cellular phones, personal digital assistants, watches and the like. In some such applications a display, such as a liquid crystal display, and/or a keypad is disposed in front of and illuminated by the light strip. In other designs, the keypad itself may be made from the light strips, such that they keys are actually light-emitting. The light strips are particularly well-suited for such applications because they may be designed to deliver different light intensities and/or colors to different parts of the device (e.g., liquid crystal display versus keypad) as needed.

DETAILED DESCRIPTION

The present invention provides light strips for use as stand alone illumination sources and as illumination sources in a variety of electronic devices. The light strips desirably take on the form of a continuous thin film of light emitting material based on electroluminescent semiconductor nanoparticles. The light strips may take on a wide range of dimensions, including long narrow tapes or plates tailored to fit specific device applications.

Figure 1:
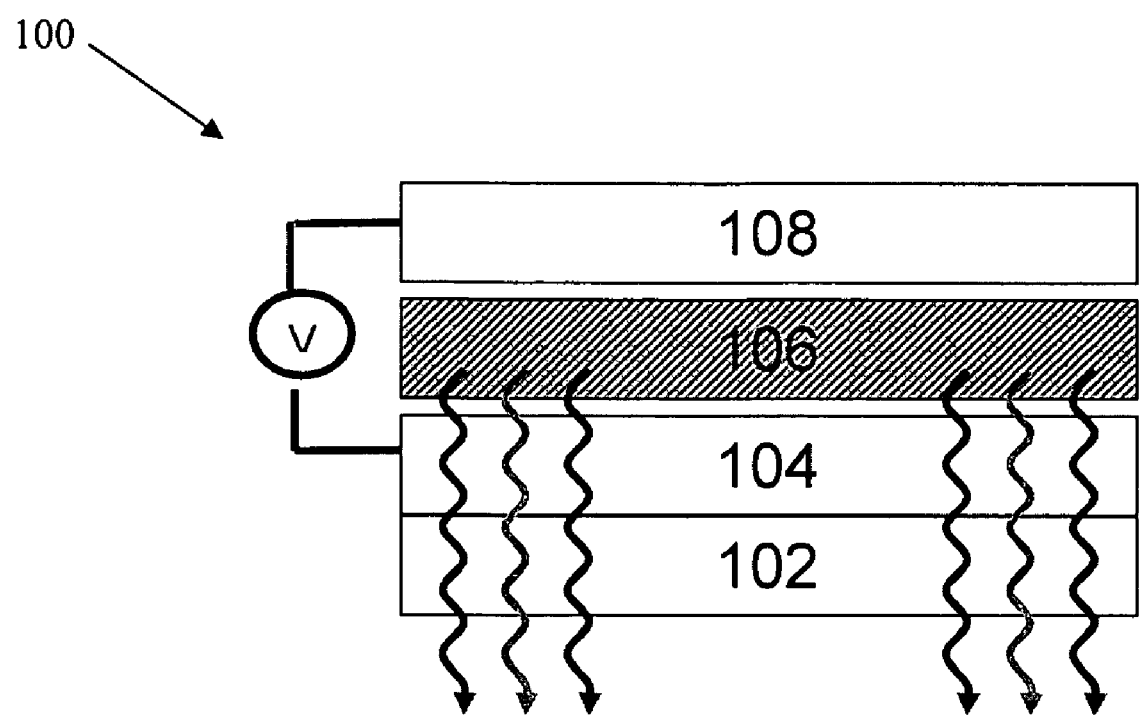
FIG. 1 shows a cross-sectional schematic diagram of a light strip in accordance with the present invention.

FIG. 1 provides an exemplary embodiment of a light strip in accordance with the present invention. The light strip presented here is a four-layered strip. 100 represents the light strip comprising multiple layers in a generally laminar arrangement. 102 represents a substrate layer that may provide a support, protective layer and/or electrical insulation layer. 104 represents a first electrode layer. Layer 104 can be disposed on and generally laminar with the substrate layer 102. 106 represents a light-emitting layer comprising a plurality of electroluminescent semiconductor nanoparticles. Layer 106 may be made from a conductive binder if the light strip is to be used with a DC source or from a dielectric binder is the light strip is to be used with an AC source. Layer 106 can be generally laminar with and disposed on the first electrode layer 104. 108 represents a second electrode layer, different from the first electrode layer. Layer 108 can be generally laminar with and disposed on the light-emitting layer 106. The second electrode layer is desirably made of a reflective material and helps to direct emitted photons out of the device. Optionally a second insulating layer (not shown) may be disposed over the second electrode layer. In one embodiment, 108 can be a cathode, and 104 can be an anode. Cathodes and anodes can be multi-layered if desired such as, for example, a bi-layer cathode or a bi-layer anode. The first and second electrode layers can sandwich the light-emitting layer 106. The first electrode layer 104 and the substrate 102 layer are desirably substantially transparent such that when an electrical signal is applied across the first and second electrodes to induce the nanoparticles in the light emitting layer to electroluminesce, as least a portion of the emitted light passes through the two layers 102 and 104. A substantially transparent layer is one that transmits enough light for a user to see, although some light may be absorbed or reflected.

Figure 2:
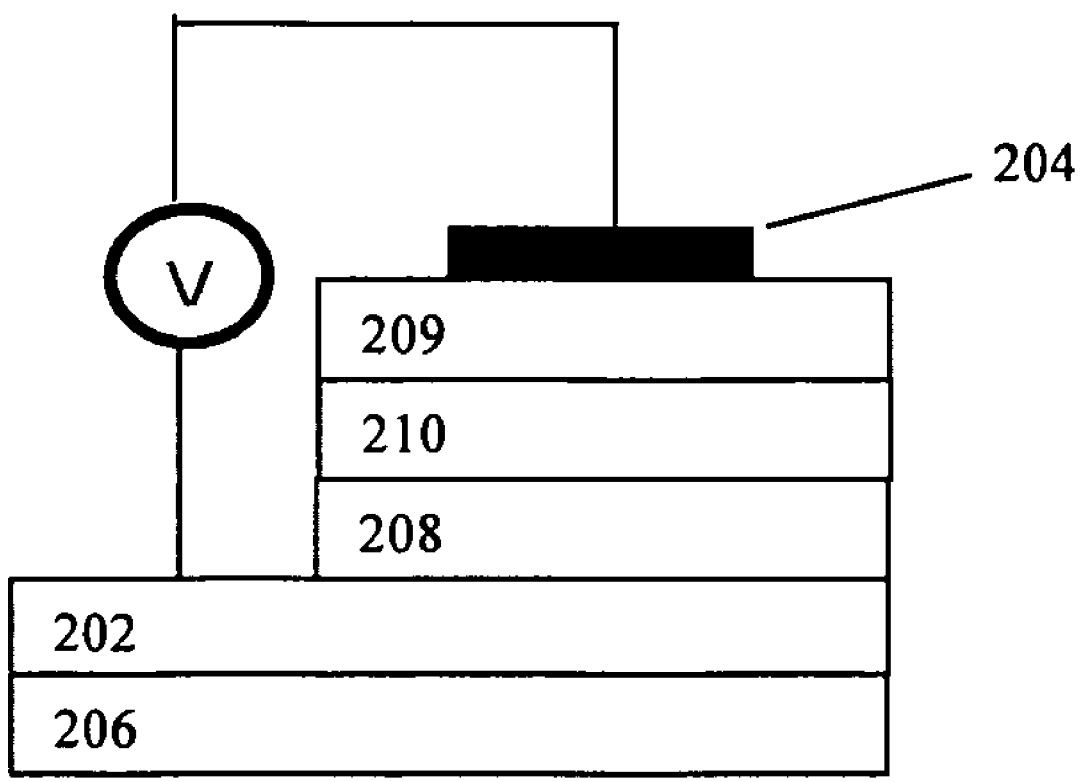
FIG. 2 shows a cross-sectional schematic diagram of a light strip based on an organic light emitting diode design.

In one specific embodiment the light strips may have an organic light emitting diode (OLED) type structure, as shown in FIG. 2. In an OLED organic films are sandwiched between two charged electrodes 202, 204. The first electrode 202 is a substantially transparent electrode, such as an indium tin oxide (ITO) thin film, optionally disposed atop a transparent substrate 206. In the embodiment depicted in FIG. 2, the OLED light strip includes a hole-transport layer 208, an electroluminescent light emitting layer 210, and an electron-transport layer 209. Both the electron transport layer and the hole transport layer may be made of a doped polymeric material, such as poly(phenylene vinylene). Other layers that may optionally be incorporated into the OLED structure include, a hole injection layer, an electron injection layer and a hole blocking layer. When a DC voltage is applied to the OLED, the injected positive and negative charges recombine in the electroluminescent emissive layer to create an illumination source.

Figure 3:
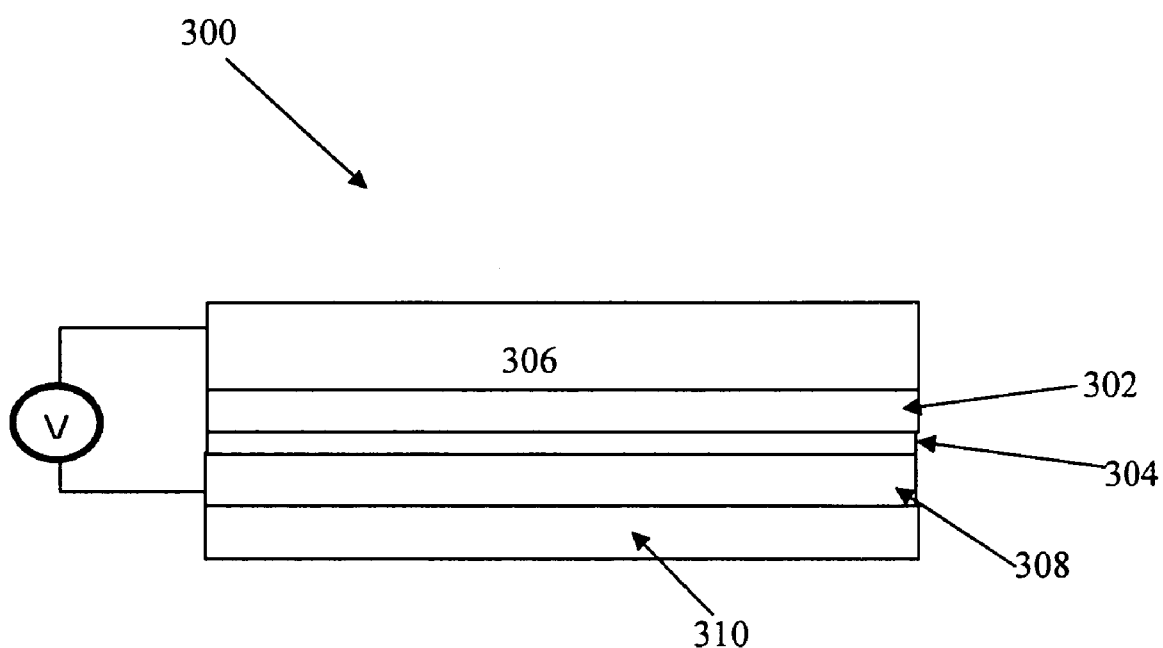
FIG. 3 shows a cross-sectional schematic diagram of a light strip that uses an AC voltage source.

FIG. 3 shows a cross-sectional view of a light strip designed for use with an AC source. In this light strip electroluminescence results from electrons flowing within an insulated light emitting layer under the influence of an applied AC bias. Thus, the light strip is essentially a capacitor formed from a dielectric layer positioned between two conductive electrodes that emits light in the presence of a strong electric field, using very little current. The light strip 300 shown in FIG. 3 includes a light emitting layer 302 disposed between a dielectric layer 304 and a substantially transparent electrode 306. Here, the light emitting layer 302 comprises semiconductor nanoparticles dispersed in a dielectric medium. Alternatively, a second dielectric layer (not shown) could be provided between the light emitting layer 302 and the substantially transparent electrode 306. In the embodiment shown in the figure, the light strip further includes a second electrode layer 308 disposed below the dielectric layer 304 and an insulating layer 310 disposed below the second electrode layer 308.

Descriptions of suitable materials and characteristics for anodes, cathodes, substrates, insulating layers, electron and hole transport layers and electron and hole blocking layers may be found in U.S. patent application Ser. No. 10/814,294 and in U.S. patent application Ser. No. 10/814,295, both filed Apr. 1, 2004, the entire disclosures of which are incorporated herein by reference. In addition, descriptions of various suitable anodes, cathodes, substrates, insulating layers and dielectric layers may be found in U.S. Pat. Nos. 4,159,443; 6,169,359; 6,252,356; 6,702,958; and 6,703,781, the entire disclosures of which are incorporated herein by reference.

The thickness of the light strip is not particularly limited. However, the light strips desirably provide a low profile illumination source. In general, the light strips should be thin and robust enough to allow for rolling, handling, packaging, and facile attachment to a variety of substrates, including floors, walls, ceilings and shelves. The thickness can be, for example, about 100 nm to about 2 mm. The thickness can be, for example, about 25 nm to about 5 microns, or more particularly about 50 nm to about 1,000 nm, and more particularly, about 50 nm to about 200 nm.

Materials for making the various layers in the light strips are known. For example, the anode may be made of ITO, tin oxide, indium oxide, zinc oxide, indium zinc oxide, aluminum oxide, gold, silver, or composite coatings, such as metal nanocrystal coatings or carbon nanotube doped polymers. Generally, the anode materials will be selected to provide the desired combination of electrical conductivity and optical transparency. Suitable cathode materials include, for example, K, Li, Na, Mg, La, Ce, Ca, Sr, Ba, Al, Ag, In, Sn, Zn, Zr, or mixtures thereof. Preferred materials for the manufacture of cathodes include Ag—Mg, Al—Li, In—Mg, and Al—Ca alloys. Tris(8-hydroxyquinolato) aluminum (Alq3) may be used as an electron-transporting material. 3-phenyl-4-(1f-naphthyl)-5-phenyl-1,2,4-triazole (TAZ) may be used as a hole blocking material. N,N'-bis(3-methylphenyl)-N,N'-diphenylbenzidine (TPD) may be used as a hole transport material. Poly-3,4-ethylenedioxythiophene (PEDOT) is a conductive polymer that may be used as a hole injection material. A more detailed description of suitable materials for the electroluminescent organic layer, the anode and the cathode is provided in U.S. Pat. No. 6,515,314, the entire disclosure of which is incorporated herein by reference.

As used herein, the term "nanoparticle" generally refers to particles that have an average diameter between about 1 nm to 100 nm and may, in some instances, include elongated particle shapes, such as nanowires, in addition to more spherical, triangular or square particles. Nanoparticles have an intermediate size between individual atoms and macroscopic bulk solids. Nanoparticles may have a size on the order of the Bohr exciton radius (e.g. 4.9 nm for silicon), of the material or less, which allows individual nanoparticles to trap individual or discrete numbers of charge carriers, either electrons or holes, or excitons, within the particle. The spatial confinement of electrons (or holes) by nanoparticles is believed to alter the physical, optical, electronic, catalytic, optoelectronic and magnetic properties of the material. The alterations of the physical properties of a nanoparticle due to confinement of electrons are generally referred to as quantum confinement effects.

Nanoparticles may exhibit a number of unique electronic, magnetic, catalytic, physical, optoelectronic and optical properties due to quantum confinement effects. For example, many nanoparticles exhibit photoluminescence or electroluminescence effects that are significantly greater than the photoluminescent or electroluminescence effects of macroscopic materials having the same composition. Additionally, these quantum confinement effects may vary as the size of the nanoparticle is varied.

The nanoparticles may typically have at least one dimension, such as an average diameter, which is about 100 nm or less, more particularly about 50 nm or less, and still more particularly about 10 nm or less. For example, the dimension can be about 0.5 nm to about 15 nm, or about 0.1 nm to about 10 nm.

The electroluminescence spectrum for each nanoparticle in a collection of nanoparticles having a polydisperse size distribution will be size dependent. Therefore, a collection of nanoparticles may be designed to include nanoparticles that emit light of different colors across the visible spectrum. By selecting nanoparticles having substantially monodisperse size distributions or by combining nanoparticles having selected, well-defined sizes, the light strips may be designed to provide substantially monochromatic light, or polychromatic light with a selected color blend. As one of skill in the art will recognize, the optimum size distribution of the nanoparticles will depend on a variety of factors, including the voltage used to excite the nanoparticles, the composition of the nanoparticles, and the desired color and quality of the emitted light. Moreover, by tailoring the density and/or size distribution of the nanoparticles along the length of a light strip, the intensity and/or color of the light emitted along the length of the light strip may be tailored for a desired application.

The semiconductor nanoparticles used to produce the light strips may be made from variety of semiconductor materials including, but are not limited to, Group IV semiconductors and alloys of Group IV semiconductors, Group II-VI semiconductors, and Group III-V semiconductors. Group IV semiconductor nanoparticles, including silicon nanoparticles, germanium nanoparticles, and SiGe alloy nanoparticles, Si or Ge cores comprising an organic or inorganic coating, or nanoparticles doped with impurities are particularly well suited for use in the light strips described herein.

The Group IV nanoparticles may be core/shell nanoparticles having a Si or Ge core coated with an inorganic shell. In some such embodiments, the inorganic shell is composed of a wider bandgap semiconductor, such as ZnS, SiC, $Si_3N_4$ or CdS. In other embodiments the core (e.g. Si) is coated with a smaller bandgap semiconductor (e.g. Ge). Alternatively, the nanoparticles may be composed of a Si core and a $Si_3N_4$ shell. Such core/shell nanoparticles may be made by adapting processes that have been used to produce larger core/shell particles or those used to produce core/shell nanoparticles for other material systems. Specific examples of such are formation of silicon/silicon nitride core/shell nanoparticles produced in a gas-phase pyrolysis method (see R. A. Bauer, J. G. M. Becht, F. E. Kruis, B. Scarlett, and J. Schoonman, *J. Am. Ceram. Soc.*, 74(11), pp. 2759-2768 (November 1991), the entire disclosure of which is incorporated herein by reference) and wet-chemical formation of cadmium selenide/zinc sulfide core/shell nanoparticles (see B. O. Dabbousi, J. Rodriguez-Viejo, F. V. Mikulec, J. R. Heine, H. Mattoussi, R. Ober, K. F. Jensen, and M. G. Bawendi, *J. Phys. Chem. B*, 101(46), pp. 9463-9475, (1997), the entire disclosure of which is incorporated herein by reference).

As discussed above, the specific emission spectrum of each nanoparticle in a collection of electroluminescent semiconductor nanoparticles is dependent upon the size of the nanoparticle. Thus, the particle size distribution of the nanoparticles in a given light strip will vary somewhat depending on the intended application.

The electroluminescent nanoparticles may desirably be surface treated with organic or inorganic passivating agents that prevent reactive degradation of the nanoparticles when exposed to water and oxygen or other chemical contaminants. Particularly suitable organic passivating agents, or "capping agents", are described in U.S. Patent Application No. 2003/0003300; Nano Letters, 2, 681-685 (2002); and J. Am. Chem. Soc., 123, 3743-3748 (2001), the entire disclosures of which are incorporated herein by reference. Other suitable passivating agents and their production are described in J. M. Buriak, Chemical Reviews, 102(5), pp. 1271-1308 (2002).

The light emitting layers in the light strips in accordance with the present invention may be composed of semiconductor nanoparticles coated on or embedded in materials acting as a support or binder for the nanoparticles. The support or binder material may have a lower refractive index than that of the nanoparticles. The support or binder material is desirably substantially transparent to the emitted electroluminescence. In one embodiment the nanoparticles are supported in a flexible polymer matrix. Non-limiting examples of suitable support or binder materials include any of various polymers such as polyvinylidene fluoride, polyethylene oxide, polyethylene, polypropylene, polytetrafluoroethylene, polyacrylates and mixtures and copolymers thereof. Other suitable polymer binders include, but are not limited to, polystyrenes, polyimides, epoxies, acrylic polymers, polyurethanes and polycarbonates. Still other suitable binders are nitrocellulose, cyanoethyl cellulose and cyanoethyl pullulan. Alternatively, the nanoparticles may be coated with or embedded in an inorganic binder, such as silica glasses, silica gels or silicone polymers.

The nanoparticles may be dispersed in a polymeric binder by mixing the nanoparticles, the binder and optionally an appropriate solvent and/or dispersants. Suitable solvents include high vapor pressure organic solvents, such as hexane, cyclohexane, toluene or xylene, which may be easily removed once the dispersion has been formed into a coating, film or layer. The mixture may then be dried, hardened, cured or otherwise solidified to provide a dispersion of nanoparticles in a solid host matrix of binder. In some embodiments, the binder takes the form of polymerizable monomers or oligomers that are polymerized after mixing with the nanoparticles. An exemplary method for dispersing nanoparticles in a epoxy binder is described in U.S. Pat. No. 6,501,091, the entire disclosure of which is incorporated herein by reference.

Figure 4:
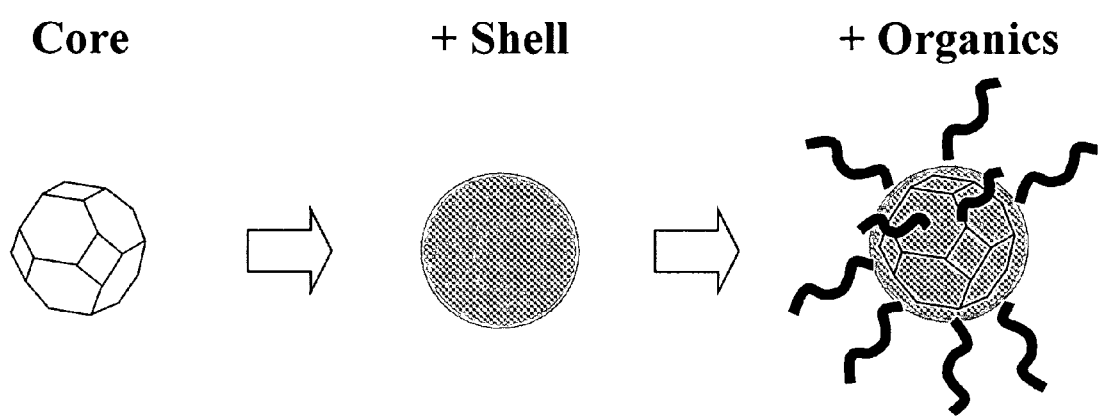
FIG. 4 shows an organic ligand-capped nanoparticle.

One advantage to using small nanoparticles, including small core/shell nanoparticles, of the type that may be produced using organic capping agents as described in the above-cited references, is that they are solution processable due to the presence of organic capping ligands attached to the outer surface of the nanoparticles. FIG. 4 is an illustration of such ligand capped nanoparticles. These soluble nanoparticles may be made with sizes that enable them to easily pass through ink jet printing heads. Thus, by making an ink from these nanoparticles together with a solvent and, optionally, an appropriate binder, a light emitting layer may be printed directly onto an underlying electrode or other substrate. This is advantageous because it allows for the design and fabrication of light emitting layers having specific color and/or intensity patterns. In addition, it eliminates the need for an inverter which is required in mobile devices using more conventional light sources. Inverters take up valuable device space, are expensive and detract from efficiency.

In some embodiments, all of the nanoparticles that make up the light emitting layer of a light strip may be embedded in the polymer binder. In other embodiments, nanoparticles that emit a single color (i.e. a group of nanoparticles having a substantially monodisperse size distribution) may be deposited or printed in a plurality of domains on top of, or dispersed in a plurality of domains within, a binder. For example, domains of red-emitting nanoparticles, domains of blue-emitting nanoparticles, and domains of green emitting nanoparticles may be present in different regions along the length of the light strip. The deposition of the domains on top of the binder may be carried out by conventional screen printing or ink-jet printing techniques. For example, monodisperse suspensions of nanoparticles representing different colors could be placed in the different printing heads of an ink jet printer and printed directly to an organic film. Ink jet printing can provide better control and higher throughput. Screen printing can be used with higher viscosity solutions. For example, screen printing of OLEDs is described in U.S. patent publication 2002/0167024, published Nov. 14, 2002, to Jabbour et al. Formation of thin film layers can be carried out by methods described in, for example, Marc J. Madou, *Fundamentals of Microfabrication, The Science of Miniaturization*, $2^{nd}$ Ed., 2002, Chapter 3. For example, silk-screening or screen printing is described on pages 154-156 with use of inks and pastes. In some embodiments, the organic film onto which the domains are printed may also have a mono or polydisperse distribution of nanoparticles embedded within it.

Two general approaches may be used to produce nanoparticles having an appropriate size distribution. In the first approach, the reaction conditions are carefully controlled during the production of the nanoparticles such that nanoparticles having a broad size distribution are produced in a single synthesis. Alternatively, batches of particles of a given size are produced separately and particles of the appropriate size are then selected and mixed together in the desired amounts.

Methods for producing semiconductor nanoparticles, including Group IV nanoparticles are known. These methods include, solution, gas, plasma and supercritical fluid based approaches. United States Patent Application No. US 2003/0003300 and J. Am. Chem. Soc., vol. 123, pp. 3743-3748 (2001) describe supercritical fluid-based approaches for making various semiconductor nanoparticles of a selected size. The entire disclosures of both of these references are incorporated herein by reference. Other suitable methods for producing Group IV nanoparticles (quantum dots) are presented in U.S. Pat. No. 6,268,041, in U.S. Patent Application Publication No. 2003/0066998, and in Huisken, et al., Adv. Mater., 14 (24), p. 1861 (2002), the entire disclosures of which are incorporated herein by reference. A plasma based synthesis for producing Si and Ge nanoparticles of controlled size in a continuous flow reactor is described in Gorla, et al., J. Vac. Sci. Technol. A., 15(3), pp. 860-864 (1997), the entire disclosure of which is incorporated herein by reference.

Alternatively, the nanoparticles may be produced in situ, as by conventional epitaxial growth processes. For example, a core-shell structure may be produced by first growing nanocrystals of a first semiconductor material, such as germanium, on a substrate, such as a silicon substrate, using well known lithographic techniques and subsequently growing an epitaxial layer of a second semiconductor material, such as silicon around the nanocrystals. Techniques for the epitaxial growth of various semiconductor materials, including chemical vapor deposition (CVD) are well-known in the art. Silicon nanoparticles may also be formed using a deconstructive approach, such as by etching from a bulk silicon wafer, followed by ultrasonic exposure and separation of the nanoparticles by different sizes. Suitable etch-based methods for producing nanoparticles may be found in Properties of Porous Silicon, Leigh Canham Ed.; INSPEC (1997), ISBN 0852969325, pp. 3-29; Heinrich, et al., Science, 255, pp. 66-68 (1992); Belomoin, et al., Appl. Phys. Lett., 77(6), p. 779-781 (2000); and Belomoin, et al., Appl. Phys. Lett., 80(5), p. 841-843 (2002), the entire disclosures of which are incorporated herein by reference.

Light-emitting group IV nanoparticles for use in the light strips are still further described in various prior art literature. For example, suitable nanoparticles are described in U.S. Patent Publications 2003/0003300 A1 to Korgel et al, published Jan. 2, 2003 and 2003/00334486 to Korgel et al., published Feb. 20, 2003 ("the Korgel patent publications"), which are hereby incorporated by reference in their entirety. These publications, for example, describe the size, morphology, passivation, and optical properties of the nanoparticles. Still further, the materials and methods of U.S. Pat. No. 6,268,041 to Goldstein can be used if desired. This patent is hereby incorporated by reference in its entirety.

Group IV nanowires are described in, for example, the following publications, which are hereby incorporated by reference in their entirety: (a) Lu, Hanrath, Johnston, and Korgel, *NanoLetters*, 2003, Vol. 3, No. 1, pgs. 93-99 ("Growth of Single Crystal Silicon Nanowires in Supercritical Solution from Tethered Gold Particles on a Silicon Substrate"); (b) Holmes, Johnston, Doty, Korgel, *Science*, 287, Feb. 25, 2000, pages 1471-1473 ("Control of Thickness and Orientation of Solution-Grown Silicon Nanowires"); and (c) Hanrath, Korgel, *J. Am. Chem. Soc.*, Vol. 124, No. 7, 2002, pages 1424-1429 ("Nucleation and Growth of Germanium Nanowires Seeded by Organic Monolayer-Coated Gold Nanocrystals"). In addition, in the making of light emitting layers, the following patents to Bawendi also can be used if desired and are hereby incorporated by reference in their entirety: U.S. Pat. Nos. 6,251,303; 6,501,091; and 6,322,901, as well as Published Application US 2001/0040232. The following Alivisatos patents also can be used if desired and are hereby incorporated by reference in their entirety: U.S. Pat. Nos. 5,537,000; 5,990,479; 6,423,551. Another patent on light emitting nanocrystals is U.S. Pat. No. 5,882,779 to Lawandy.

Using one or more the above-referenced methods, nanoparticle size control can be obtained by controlling the synthesis conditions, such as reaction temperature, pressure, precursor concentration, flow rate, dilutant type, dilutant concentration, reagent type and reagent concentration. Because the particle size distribution can be controlled, the nanoparticles provide a single material solution for color tuning in the visible spectrum. Other noteworthy attributes of the particles may include one or more of the following: temperature and humidity independent emissions, high quantum efficiencies, use of a single material to reach the entire visible range, fast radiative rates, and, in the case of Si nanoparticles, a 1:1 lattice match with bulk silicon. With proper passivation, the nanoparticles can be stored on a shelf for years without degradation. The different size (color) particles also may not suffer from differential aging, allowing the devices to maintain constant color quality over time.

Light strips made from the nanoparticles are desirably, but not necessarily, thin, flexible laminar films and light emitting layers in the light strips are desirably, but not necessarily, continuous thin films, where "continuous" simply indicates that the light emitting layer is a single piece of material, although the density and size distribution of the nanoparticles in the film may be non-uniform. The thickness of the light emitting layer containing the semiconductor nanoparticles in the light strips is not particularly limited but can be, for example, about 4 nm to about 1 mm, more particularly, about 50 nm to about 100 microns, and more particularly, about 100 nm to about 50 microns. The light emitting layer can be sufficiently thin to be a monolayer of nanoparticles, wherein the thickness of the material is approximately the diameter of the nanoparticle.

The light strips are well-suited for use as stand-alone illumination sources for accent lighting, path lighting and emergency lighting. In some such applications the light strips include a light emitting layer having a nanoparticle density gradient along its length. These light strips would emit a light of increasing intensity along one direction. This lighting design could be useful, for example, to indicate the direction of a destination, such as an exit, where the light becomes more intense as the light strip approaches the destination. Alternatively, the light strips may include a light emitting layer having a plurality of regions along its length, wherein different regions have a different nanoparticle size distribution. These light strips would emit light of different colors from different regions along their length. This lighting design could be useful, for example, to highlight different sections or objects along a path. For example, a walkway or aisle could be illuminated in one color while the periphery of a door way could be illuminated in a different color. In other embodiments the intensity and/or size distribution of nanoparticles in the light strips may be designed to provide an intensity and/or color pattern along the light strips for decorative purposes. Locations where the light strips may advantageously be used as stand alone illumination sources include airplanes, movie theaters and retail stores (e.g., to highlight displays) The light strips may also be used to provide low-level illumination for cupboards and shelves in bookcases, bars and the like.

Another advantage to using a light emitting layer having a plurality of separate regions with different nanoparticle density distributions is that if one region has a defect (e.g., a pin hole defect) that produces a short, that defect can be isolated to that region while other regions which are electrically isolated from the defective region remain unaffected.

The light strips provided herein are also well-suited for use as lighting in electronic devices. Examples of devices that may be lit by the present light strips include, but are not limited to, cellular phones, personal digital assistants (PDAs), watches, personal computers and car audio components. Because the present light strips have low power requirements, they are particularly suited for lighting in portable battery operated devices, such as PDAs and cellular phones where power usage directly affects battery life. For example, the light strips may be used to backlight display screens and/or keypads. In such devices a display or a substantially transparent keypad would be placed in front of (i.e., in the light emission path of) a light strip. Alternatively, the lighted components of electronic devices, including the keys of a keypad, may directly incorporate the light strips into their structure, such that the components are themselves light-emitting.

Liquid crystal displays are an example of the type of display that may be lit with a light strip in accordance with the present invention. Electronic devices that include both a display and a keypad may include a single light strip to illuminate both the display and the keypad. Where the light strip is used as a backlighting source the light strip would desirably have dimensions such that it fit beneath the face plate of the device. Because liquid crystal displays tend to absorb a lot of light (e.g., up to 90% of the backlight), it may be desirable to provide a light strip that emits a higher light intensity from the area behind the display screen and a lower light intensity from the area behind the keypad. This could be accomplished by using a light strip with a light emitting layer having a first region (i.e., the region behind the keypad) that has a higher density of nanoparticles than a second region (i.e., the region behind the keypad). Alternatively, it may be desirable to provide a light strip that emits a first color light (e.g., white light) from the area behind the display screen and a second color light (e.g., a blue light) from the area behind the keypad. In some embodiments, the light strips may be designed to illuminate different keys on a keypad with different colors of light.

Figure 5:
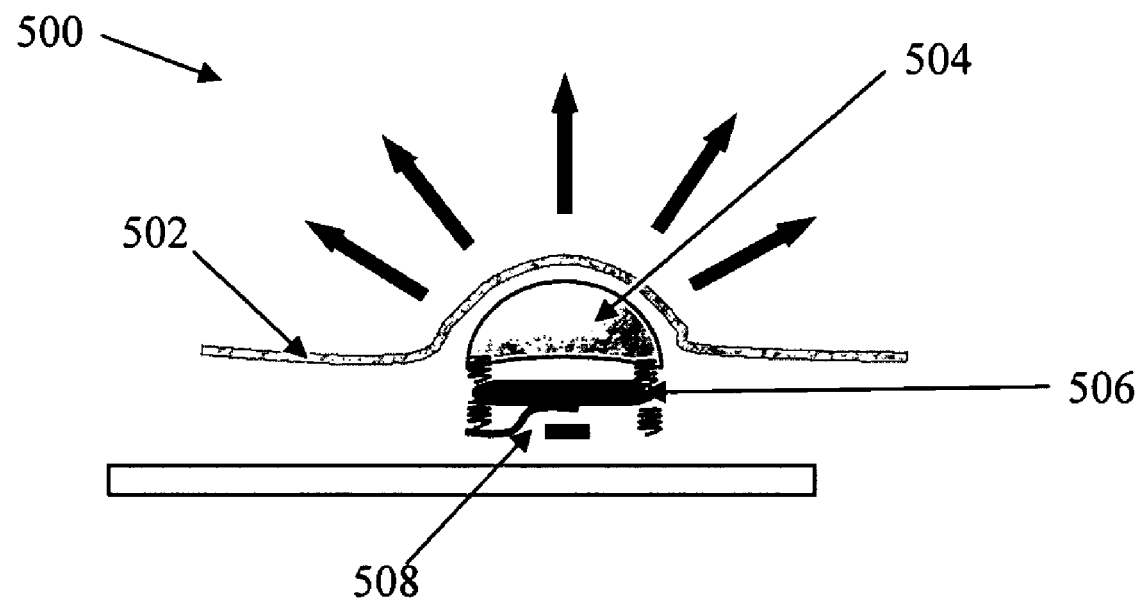
FIG. 5 shows a cross-sectional schematic diagram of a portion of a keypad backlit by a light strip in accordance with the present invention.

FIG. 5 is a schematic cross-sectional view of a part of a keypad 500 that is backlit using a light strip in accordance with the present invention. The keypad includes a protective faceplate 502 (optional) and at least one key 504 disposed below the faceplate. The faceplate 502 and key are desirably made of a transparent material, such as a plastic. The light strip 506 is disposed below the key 504 such that light emitted from the light strip 506 passes through the key 504 and the faceplate 502. When the device is turned on, a voltage (e.g., supplied from a battery in the device) is applied across the light strip, causing the nanoparticles in the light emitting layer is electroluminesce. The light strip is disposed over a push-type switch 508. The push-type switch completes a circuit in the electronic device when the at least one key 504 is pressed by a user.

Figure 6:
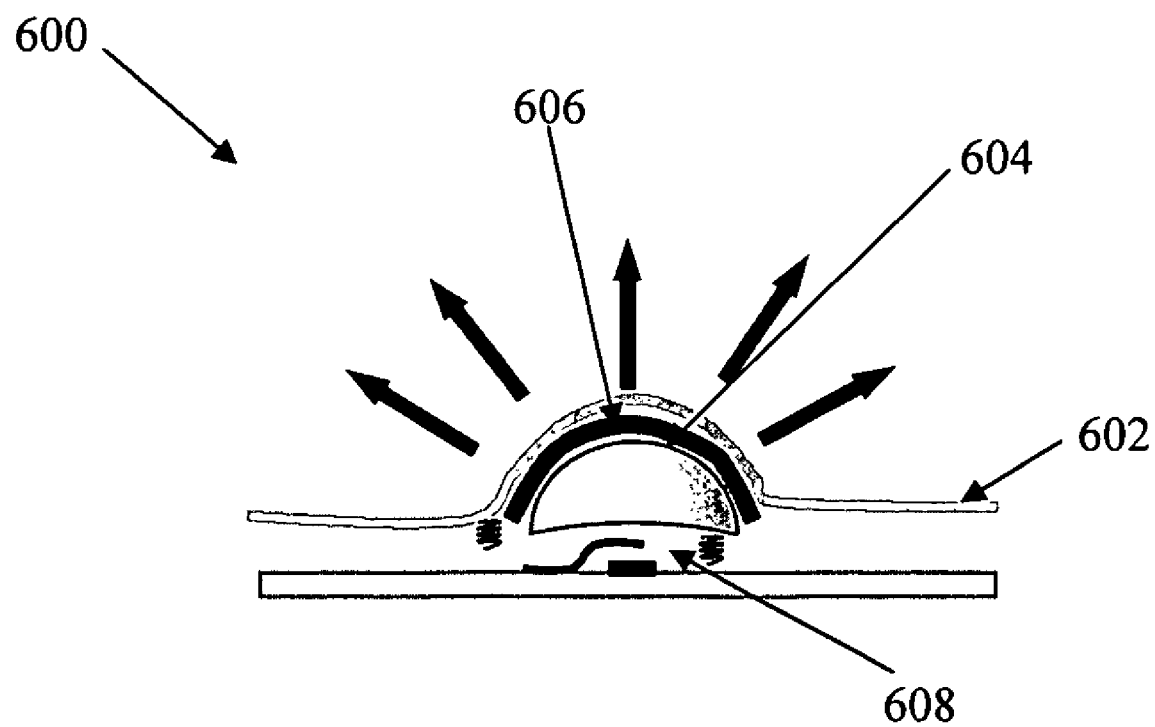
FIG. 6 shows a cross-sectional schematic diagram of a portion of a keypad having a light strip incorporated directly into a key.

FIG. 6 is a schematic cross-sectional view of a part of a keypad 600 having a light strip incorporated into a key in accordance with the present invention. The keypad includes a protective faceplate 602 (optional) and at least one key 604 disposed below the faceplate. The faceplate 602 and key are desirably made of a transparent material, such as a plastic. A light strip 606 is incorporated into the at least one key 604. In the embodiment depicted in the figure, the light strip defines the upper surface of the key. When the device is turned on, a voltage (e.g., supplied from a battery in the device) is applied across the light strip, causing the nanoparticles in the light emitting layer is electroluminesce. The light strip is disposed over a push-type switch 608. The push-type switch completes a circuit in the electronic device when the at least one key 604 is pressed by a user.

Figure 7:
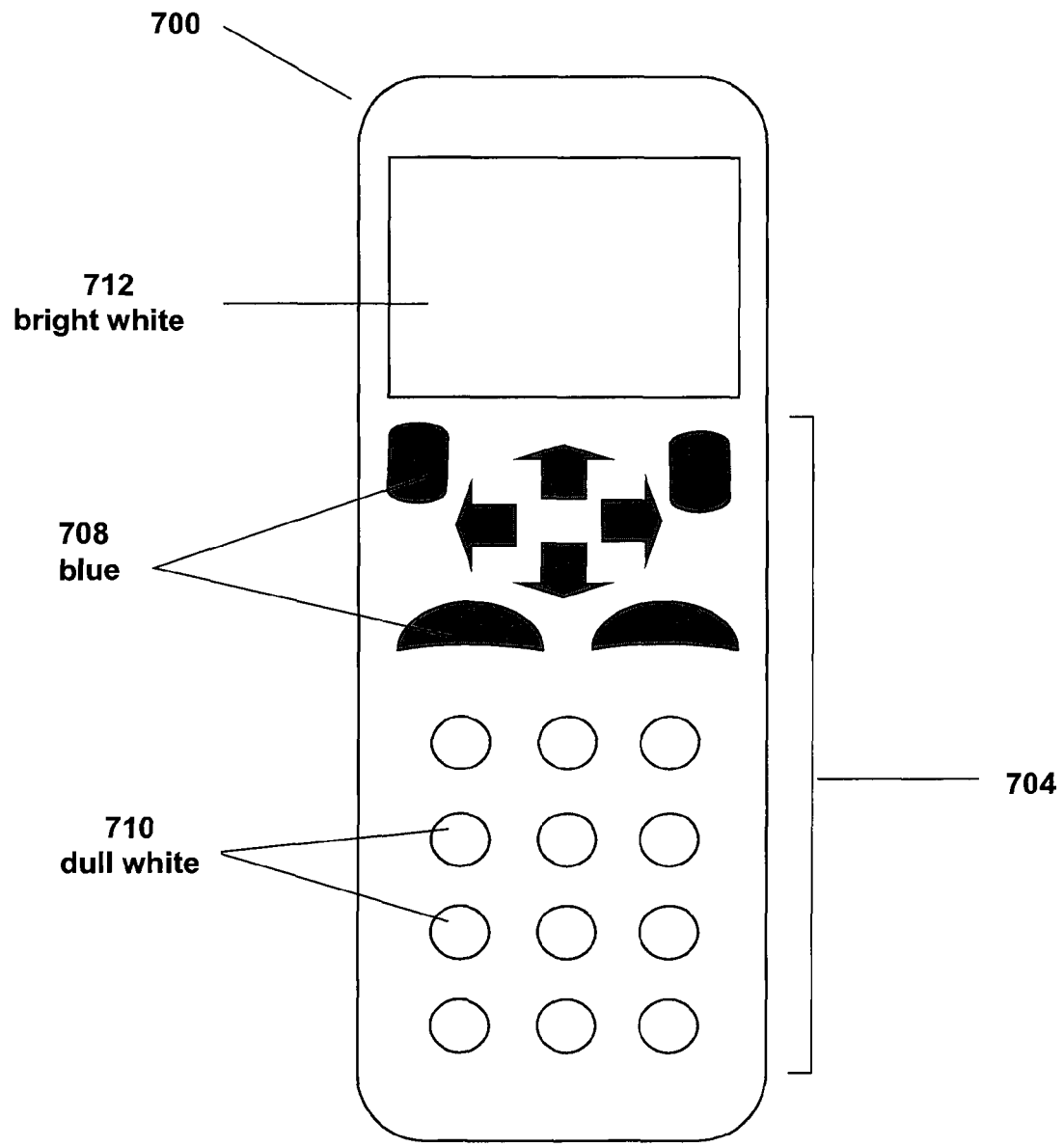
FIG. 7 shows an embodiment of an electronic device having a lighted keypad.

FIG. 7 is a schematic illustration of an electronic device which can incorporate any of the disclosed light strips. The device 700 has a keypad 704 having keys 708 and 710. The device also includes a display 712. The device further includes any of the light strips disclosed herein. In FIG. 7, a single light strip is used to illuminate both the display and the keypad. Furthermore, the light strip is configured so that the display 712 is of a higher intensity and different color (bright white) than the keys 708 (blue) and 710 (dull white) of the keypad.

For the purposes of this disclosure and unless otherwise specified, "a" or "an" means "one or more". All patents, applications, references and publications cited herein are incorporated by reference in their entirety to the same extent as if they were individually incorporated by reference.

While the principles of this invention have been described in connection with specific embodiments, it should be understood clearly that these descriptions are made only by way of example and are not intended to limit the scope of the invention.

What is claimed is:

1. An electronic device with a lighted keypad, the device comprising a keypad having at least one key, the at least one key incorporating a light strip comprising:
   (a) a first substantially transparent electrode layer;
   (b) a second electrode layer;
   (c) a plurality of electroluminescent nanoparticles consisting of quantum confined, crystalline silicon nanocrystals surface treated with an organic or inorganic passivating agent which prevents degradation of the nanoparticles caused by oxygen, said nanoparticles being disposed between the first substantially transparent electrode layer and the second electrode layer,
   wherein the device further comprises a display lit by the light strip, the light strip providing a single light strip to illuminate both the display and the keypad, and wherein the display is illuminated with light of a higher intensity or light of a different color than the keypad, and wherein the light strip operates without an inverter by switching between an alternating current and direct current voltage source.

2. The device of claim 1 wherein the electronic device is a cellular phone.

3. The device of claim 1 wherein the electronic device is a personal digital assistant.

4. The device of claim 1 wherein the electronic device is a watch.

5. The device of claim 1 further comprising a push-type switch disposed below the at least one key.

6. The device of claim 1 wherein the display is illuminated with light of higher intensity than the keypad.

7. The device of claim 1 wherein the display is illuminated with light of a different color than the keypad.

8. A light strip comprising:
(a) a first substantially transparent electrode layer;
(b) a second electrode layer; and
(c) a light emitting layer comprising a plurality of electroluminescent nanoparticles consisting of quantum confined crystalline silicon nanocrystals surface treated with an organic or inorganic passivating agent which prevents degradation caused by oxygen, said nanoparticles being disposed between the first substantially transparent electrode layer and the second electrode layer;
wherein the light emitting layer comprises nanoparticle density domains along the length of the light emitting layer and the density domains are separated such that a defect in one domain does not affect the remaining domains, further wherein at least two domains have different densities of nanoparticles, and further wherein the light strip operates without an inverter by switching between an alternating current and direct current voltage source.

9. The light strip of claim 8 wherein the light emitting layer comprises a density gradient of nanoparticles along the length of the light emitting layer.

10. The light strip of claim 8 wherein the size distribution of nanoparticles is non-uniform along the length of the light emitting layer.

11. A lighted electronic device comprising:
(a) the light strip of claim 8;
(b) a display lit by the light strip; and
(c) a keypad lit by the light strip.

12. The lighted electronic device of claim 11 wherein the device is selected from the group consisting of cellular phones, personal digital assistants and personal computers.

13. An egress illuminated by the light strip of claim 8.

14. A shelf illuminated by the light strip of claim 8.

15. The light strip of claim 8, wherein the nanoparticles are dispersed in a dielectric medium and the light strip further comprises a dielectric layer disposed between the second electrode layer and the light emitting layer and an insulating layer disposed below the second electrode layer.

* * * * *